June 23, 1959 L. DOSHAY 2,892,043
DIRECT COUPLED CASCADE AMPLIFIER
Filed March 4, 1955
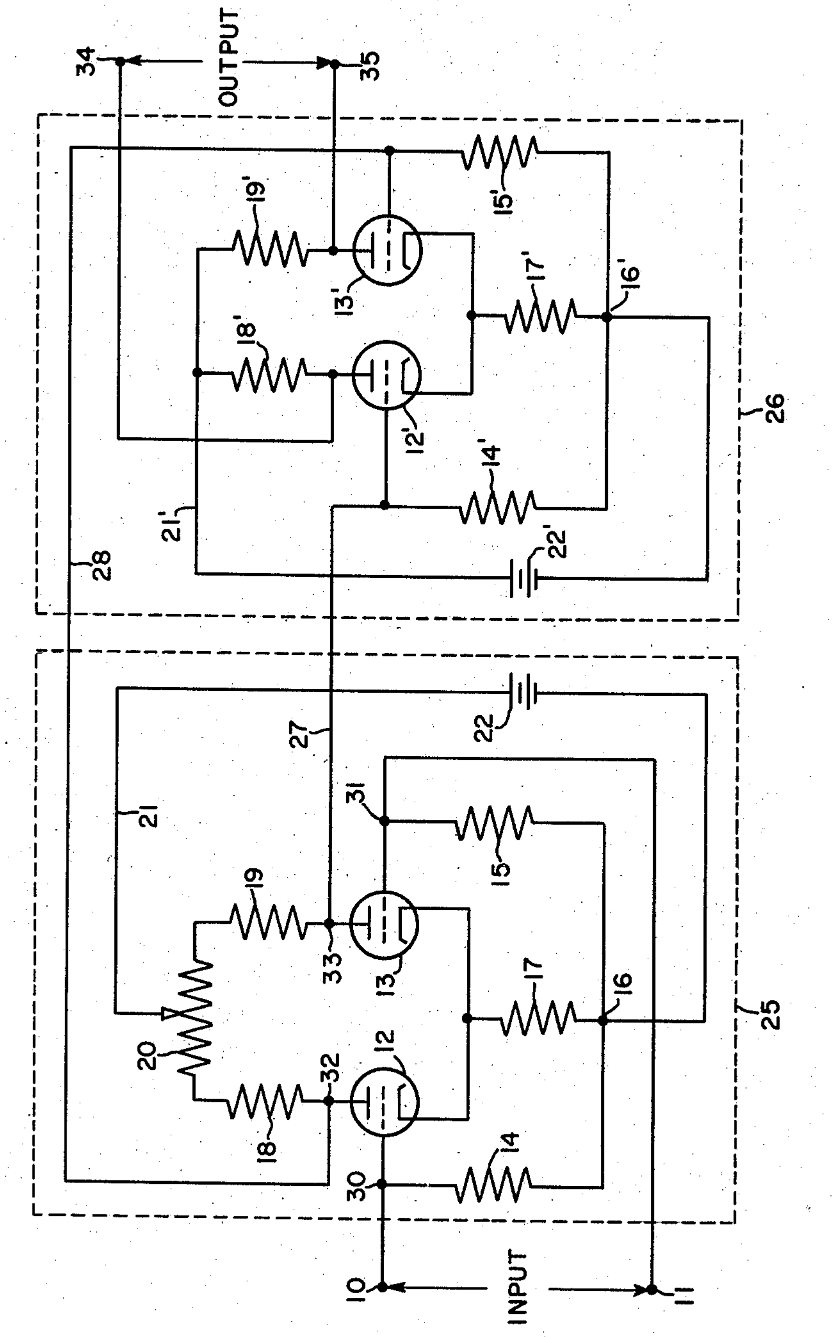
INVENTOR.
LOUIS DOSHAY
BY [signature]
[signature]
ATTORNEYS 2,892,043
Patented June 23, 1959

2,892,043

DIRECT COUPLED CASCADE AMPLIFIER

Louis Doshay, Van Nuys, Calif.

Application March 4, 1955, Serial No. 492,319

2 Claims. (Cl. 179—171)

(Granted under Title 35, U.S. Code (1952), sec. 266)

The invention described herein may be manufactured and used by or for the Government of the United States of America for governmental purposes without the payment of any royalties thereon or therefor.

The present invention relates to a direct coupled cascade amplifier and more particularly to a cascade amplifier employing two pairs of balanced resistors between each stage of the amplifier which are so connected as to effectively isolate each stage from the succeeding stage.

The present invention concerns amplifiers which are adapted for amplifying both direct currents and a wide band of frequencies of alternating currents. In such direct coupled type amplifiers, it is necessary to provide the proper D.C. operating potentials for the electronic valves utilized therein. Prior art amplifiers of this type utilized voltage divider or similar networks which provide common elements between stages and are also connected to a common power supply and ground. Such networks provide feedback paths between the stages which result in undesirable drift and instability. When it is desired to amplify alternating voltages with prior art amplifiers, it is additionally necessary to provide decoupling networks which are only effective at relatively high frequencies and consequently the operation of the amplifier is altered at low frequencies. The utilization of resistive and capacitative components in such decoupling networks also results in variations of frequency response characteristics accompanied by undesirable phase shifts.

The present invention employs two pairs of balanced resistors between stages of the amplifier which are so connected that there is no common power supply or ground between the stages whereby there are no paths for signal flow from points of high gain to points of low gain, and the necessity for decoupling networks is eliminated.

An object of the present invention is the provision of a new and novel direct coupled cascade amplifier for use in amplifying D.C. and A.C. potentials with maximum stability and minimum drift.

Another object is to provide a cascade amplifier which eliminates the necessity of providing decoupling networks.

A further object of the invention is the provision of a cascade amplifier which is simple and inexpensive in construction, yet sensitive and reliable in operation.

Other objects and many of the attendant advantages of this invention will be readily appreciated as the same becomes better understood by reference to the following detailed description when considered in connection with the accompanying drawing which illustrates a preferred embodiment of the invention.

The circuitry of the present invention may be utilized equally well with vacuum tubes or transistors and consequently the term electronic valve as utilized in the specification and claims is intended to denote either a vacuum tube, a transistor, or the like.

The following generic terms are intended to have the meanings as set forth hereinafter:

"Emitting electrode" is intended to denote either the emitter of a transistor or the cathode of a vacuum tube; "controlling electrode" is intended to denote either the base of a transistor or the grid of a vacuum tube; "collecting electrode" is intended to denote either the collector of a transistor or the plate of a vacuum tube. It is therefore apparent to one skilled in that art that vacuum tubes and transistors may be substituted for one another as desired in the invention circuit by merely connecting the corresponding elements of a transistor to the components illustrated as connected to the elements of vacuum tubes in the drawing. Vacuum tubes have been used as an illustrative example throughout the description and drawing.

Referring now to the drawing, there is shown a plurality of input terminals 10 and 11 upon which the A.C. or D.C. input voltage is impressed. Terminal 10 is connected to the grid of a triode 12 and terminal 11 is connected to the grid of a triode 13. It is apparent that tetrodes, pentodes or other types of tubes conventionally used in amplifiers may be substituted for tubes 12 and 13. Two balanced resistors 14 and 15 are connected in series with one another and in shunt across the grids or controlling electrodes of tubes 12 and 13. Resistors 14 and 15 which are referred to as balanced resistors are resistors which have substantially the same impedance as measured by conventional testing devices.

Point 16 in the connection between resistors 14 and 15 may be called a center point and is the balance point of the control electrode input voltage appearing between resistors 14 and 15 from control electrode of tube 12 to the control electrode of tube 13. The cathode or emitting electrodes of tubes 12 and 13 are connected to point 16 through a common biasing resistor 17 which provides the necessary cathode bias. It is evident that a suitable battery may be substituted for resistor 17 to provide the cathode bias if desired.

The plates of tubes 12 and 13 are connected to one another by means of a connection including balanced resistors 18 and 19 and a potentiometer 20 each of which are connected in series with one another and in shunt with the plates. Balanced resistors 18 and 19 are of substantially equal value and it should be noted that lead 21 which is connected to the plates through potentiometer 20 may if desired be fixedly connected to a point which is substantially midway between resistors 18 and 19. However, potentiometer 20 is provided to balance out the entire circuit for small variations in the value of the various components. Lead 21 is connected to a source of electrical energy 22 in the form of a battery which is in turn connected to point 16. Battery 22 provides the B+ voltage for tubes 12 and 13 and it is apparent that other conventional sources of power may be utilized if desired.

The first stage 25 of the amplifier is substantially identical with a second stage 26 thereof, and similar elements are indicated by similar primed reference characters. The only difference between stage 25 and stage 26 is that point 16' in the second stage is connected through battery 22' directly to the plates of the tubes of the second stage without the provision of a potentiometer. This is due to the fact that the potentiometer 20 in the first stage is adapted to balance out the entire circuit; however, if lead 21 in the first stage were fixedly connected to a point substantially midway between resistors 18 and 19, lead 21' in the second stage would be similarly connected.

Leads 27 and 28 provide a means whereby the plate or collecting electrode voltages of valves 12 and 13 of the first stage are impressed upon the control electrodes and resistors 14' and 15' of the second stage in push-pull just as the input voltage is impressed on the control electrodes of the first stage. It will be apparent to one skilled in the art that the control electrode voltage input of each stage may be connected in either push-pull or may be single-ended.

Conventional balancing potentiometers may be used in the plate and/or cathode circuits of any or all stages of the amplifier and gain control potentiometers may be inserted in either the cathode or grid circuits of any or all stages in a well-known manner. It is apparent that any number of stages may be connected to output terminals 34 and 35 employing connections between subsequent stages similar to those illustrated between stages 25 and 26.

When an input control signal is fed into the circuit across balanced resistors 14 and 15, the voltage impressed between point 30 and point 16 is equal to the voltage impressed between point 31 and point 16. The grids of tubes 12 and 13 are equally self-biased with respect to the cathodes by means of the current flowing through the common cathode resistor 17, and balanced resistors 18 and 19 provide equal static plate voltages. Therefore, with no input signal, the currents flowing through both tubes will be equal if the tube conductances and the emission are balanced. This provides a balanced dynamic push-pull output voltage at points 32 and 33. The operation of the second stage 26 is identical with that of the first stage 25. It may therefore be seen that there is no possible path for signal flow between the two stages from points of high gain to points of low gain thereby eliminating the major sources of drift and instability. It should also be noted that common ground connections have been eliminated and that a separate or floating power supply is provided for each stage.

From the foregoing, it is apparent that there is provided a new and novel direct coupled cascade amplifier which is adapted for use in amplifying direct and alternating currents with maximum stability and a minimum amount of drift. The device eliminates the necessity of decoupling net works and is simple and inexpensive in construction, yet sensitive and reliable in operation.

Obviously many modifications and variations of the present invention are possible in the light of the above teachings. It is therefore to be understood that within the scope of the appended claims the invention may be practiced otherwise than as specifically described.

I claim:

1. A multi-stage direct-coupled cascade amplifier each stage of which incorporates a pair of electronic amplifier units each having an emitter electrode, a control electrode, and a collector electrode; a plurality of first pairs of balanced resistors respectively connected in series between the control electrodes of the two amplifier units of each of said stages; an independent power source for each said amplifier stage, the mid-point of the said first pair of balanced resistors of each stage being connected to one terminal of its associated power source; a biasing means for each amplifier stage, the said one power source terminal also being connected to the emitter electrodes of the amplifier units of such stage through said biasing means; a plurality of second pairs of balanced resistors respectively connected in series between the collector electrodes of the two amplifier units of each of said stages, the remaining terminal of the said power source of each said stage being connected to the mid-point of the said second pair of balanced resistors respectively associated with each stage; respective connections from the colletcor electrodes of the amplifier units of each stage to the control electrodes of the amplifier units of the following stage; means for applying an input signal to the control electrodes of the amplifier units of the first of said stages; and output connections from the collector electrodes of the amplifier units of the last of said stages, each of said stages being characterized by the absence of any point of low potential which is common to more than one stage, and also by the inclusion of an independent power source from which operating energy is supplied only to the components of the amplifier stage in which it is incorporated, thus precluding undesirable interstage signal feedback through such common low potential point and through such power source, and resulting in an increase in the over-all stability of the multi-stage amplifier network.

2. A two-stage direct-coupled cascade amplifier comprising two pairs of electron discharge devices, each such device including an emitter, a collector, and a control electrode, four pairs of balanced impedances respectively connected in series between the collector and control electrodes of said two pairs of electron discharge devices, a pair of independent power sources respectively associated with said pair of electron discharge devices, one terminal of each power source being connected to a point between the pair of balanced impedances associated with the collector electrodes of its associated pair of electron discharge devices, and the remaining terminal of each power source being connected to a point between the pair of balanced impedances associated with the control electrodes of said pair, means for biasing the emitter electrodes of each pair of electron discharge devices from a point between the pair of balanced impedances associated with the control electrodes of such pair, connections respectively between the collector electrodes of one pair of electron discharge devices and the control electrodes of the remaining pair, means for applying an input signal to the control electrodes of said one pair of electron discharge devices, and output connections from the collector electrodes of said remaining pair of electron discharge devices.

References Cited in the file of this patent

UNITED STATES PATENTS

| | | |
|---|---|---|
| 2,590,104 | King | Mar. 25, 1952 |
| 2,631,198 | Parisoe | Mar. 10, 1953 |
| 2,687,935 | Cannon | Aug. 31, 1954 |
| 2,757,244 | Tomcik | July 31, 1956 |
| 2,777,018 | Russell | Jan. 8, 1957 |

OTHER REFERENCES

Text: "Vacuum Tube Amplifiers," by Valley and Wallman Radiation Lab. Series, vol. 18, pages 479–485, Figs. 11.62, 11.63, 11.64; publishing date October 1948.